(12) United States Patent
Ren et al.

(10) Patent No.: US 11,201,179 B2
(45) Date of Patent: Dec. 14, 2021

(54) THIN FILM TRANSISTOR ASSEMBLY, ARRAY SUBSTRATE AND DISPLAY PANEL

(71) Applicants: ORDOS YUANSHENG OPTOELECTRONICS CO., LTD., Ordos (CN); BOE TECHNOLOGY GROUP CO., LTD., Beijing (CN)

(72) Inventors: Yanwei Ren, Beijing (CN); Wulijibaier Tang, Beijing (CN); Xiaoguang Li, Beijing (CN); Jingyi Xu, Beijing (CN); Yuelin Wang, Beijing (CN); Lei Jia, Beijing (CN); Yanan Yu, Beijing (CN); Guolei Zhi, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/825,006

(22) Filed: Mar. 20, 2020

(65) Prior Publication Data
US 2021/0091123 A1 Mar. 25, 2021

(30) Foreign Application Priority Data
Sep. 19, 2019 (CN) .......................... 201910887397.3

(51) Int. Cl.
*H01L 27/00* (2006.01)
*H01L 29/00* (2006.01)
(Continued)

(52) U.S. Cl.
CPC ...... *H01L 27/1251* (2013.01); *H01L 27/1248* (2013.01); *H01L 29/41733* (2013.01)

(58) Field of Classification Search
CPC ......... H01L 21/31111; H01L 21/76802; H01L 21/76877; H01L 21/02667; H01L 23/5226;
(Continued)

(56) References Cited

U.S. PATENT DOCUMENTS 5,675,185 A * 10/1997 Chen .................. H01L 27/0688
257/752
5,869,867 A * 2/1999 Takeuchi .......... H01L 29/78648
257/347
(Continued)

FOREIGN PATENT DOCUMENTS

CN 105633099 A 6/2016
CN 106168865 A 11/2016
(Continued)

OTHER PUBLICATIONS

First Chinese Office Action dated Jun. 3, 2021, received for corresponding Chinese Application No. 201910887397.3, 16 pages.

*Primary Examiner* — Nikolay K Yushin
(74) *Attorney, Agent, or Firm* — Kinney & Lange, P.A.

(57) ABSTRACT

Embodiments of the present disclosure provide a thin film transistor assembly, an array substrate and a display panel. The thin film transistor assembly includes a first thin film transistor and a second thin film transistor disposed on a substrate. The first thin film transistor includes a first source electrode, a first drain electrode, and a first active layer. The second thin film transistor includes a second source electrode. The first source electrode is disposed on a side of the first active layer facing towards the substrate. The first drain electrode is disposed on a side of the first active layer facing away from the substrate. An orthogonal projection of the first source electrode on the substrate overlaps an orthogonal projection of the second source electrode on the substrate.

17 Claims, 7 Drawing Sheets

(51) Int. Cl.
*H01L 27/12* (2006.01)
*H01L 29/417* (2006.01)

(58) Field of Classification Search
CPC ............ H01L 23/5283; H01L 23/4284; H01L 23/49575; H01L 27/11582; H01L 27/11556; H01L 27/127; H01L 27/124; H01L 27/3262; H01L 29/40114; H01L 29/40117; H01L 29/7883; H01L 29/78696; H01L 29/78675; H01L 29/41733
See application file for complete search history.

(56) References Cited

U.S. PATENT DOCUMENTS

| | | | |
|---|---|---|---|
| 6,628,355 B1* | 9/2003 | Takahara | G09G 3/3648 349/106 |
| 2016/0126356 A1* | 5/2016 | Hsu | H01L 27/1225 257/43 |
| 2017/0170251 A1 | 6/2017 | Moon et al. | |
| 2018/0122836 A1 | 5/2018 | Kang et al. | |
| 2018/0158844 A1 | 6/2018 | Choi et al. | |
| 2018/0260058 A1 | 9/2018 | Zhan et al. | |
| 2019/0019816 A1 | 1/2019 | Kang et al. | |
| 2019/0131365 A1 | 5/2019 | Jung | |
| 2020/0105799 A1* | 4/2020 | Yuan | H01L 29/41733 |
| 2020/0203392 A1 | 6/2020 | Kang et al. | |
| 2020/0243570 A1 | 7/2020 | Choi et al. | |
| 2020/0279899 A1 | 9/2020 | Zhang et al. | |
| 2021/0151472 A1 | 5/2021 | Kang et al. | |

FOREIGN PATENT DOCUMENTS

| CN | 206301805 U | 7/2017 |
|---|---|---|
| CN | 107248393 A | 10/2017 |
| CN | 108022940 A | 5/2018 |
| CN | 108172595 A | 6/2018 |
| CN | 109742131 A | 5/2019 |

* cited by examiner

THIN FILM TRANSISTOR ASSEMBLY, ARRAY SUBSTRATE AND DISPLAY PANEL

CROSS-REFERENCE TO RELATED APPLICATION

This application claims priority to Chinese Patent Application No. 201910887397.3, filed on Sep. 19, 2019, entitled "THIN FILM TRANSISTOR ASSEMBLY, ARRAY SUBSTRATE AND DISPLAY PANEL", which is incorporated herein by reference in its entirety.

TECHNICAL FIELD

Embodiments of the present disclosure relate to the field of display technology, and particularly to a thin film transistor assembly, an array substrate and a display panel.

BACKGROUND

A light transmittance of a display panel will be affected by a wiring of the display panel, and the light transmittance of the display panel will in turn affect an overall brightness of the display panel.

SUMMARY

In an aspect of the present disclosure, embodiments of the present disclosure provide a thin film transistor assembly. According to embodiments of the present disclosure, the thin film transistor assembly includes: a first thin film transistor and a second thin film transistor disposed on a substrate, wherein the first thin film transistor includes a first source electrode, a first drain electrode, and a first active layer, the second thin film transistor includes a second source electrode, the first source electrode is disposed on a side of the first active layer facing towards the substrate, the first drain electrode is disposed on a side of the first active layer facing away from the substrate, and an orthogonal projection of the first source electrode on the substrate overlaps an orthogonal projection of the second source electrode on the substrate.

According to embodiments of the present disclosure, the orthogonal projection of the second source electrode on the substrate covers the orthogonal projection of the first source electrode on the substrate.

According to embodiments of the present disclosure, the second thin film transistor further includes a second drain electrode, and the second source electrode and the second drain electrode are disposed in a same layer as the first drain electrode.

According to embodiments of the present disclosure, the second source electrode is disposed between the first drain electrode and the second drain electrode in an arrangement direction of the first thin film transistor and the second thin film transistor.

According to embodiments of the present disclosure, the first thin film transistor and the second thin film transistor are both top-gate thin film transistors, or the first thin film transistor and the second thin film transistor are both bottom-gate thin film transistors.

According to embodiments of the present disclosure, the first source electrode is disposed on the substrate.

According to embodiments of the present disclosure, the first source electrode is disposed on the substrate, and the thin film transistor assembly further includes: a buffer layer disposed on the substrate and covering the first source electrode; a gate insulating layer disposed on a side of the buffer layer facing away from the substrate; and an interlayer dielectric layer disposed on a side of the gate insulating layer facing away from the substrate, the first drain electrode, the second source electrode, and the second drain electrode being disposed on a side of the interlayer dielectric layer facing away from the substrate.

According to embodiments of the present disclosure, the first active layer and a second active layer of the second thin film transistor are disposed on the buffer layer, the gate insulating layer covers the first active layer and the second active layer, a first gate electrode of the first thin film transistor and a second gate electrode of the second thin film transistor are disposed on the gate insulating layer, and the interlayer dielectric layer covers the first gate electrode and the second gate electrode.

According to embodiments of the present disclosure, a first gate electrode of the first thin film transistor and a second gate electrode of the second thin film transistor are disposed on the buffer layer, the gate insulating layer covers the first gate electrode and the second gate electrode, the first active layer and a second active layer of the second thin film transistor are disposed on the gate insulating layer, and the interlayer dielectric layer covers the first active layer and the second active layer.

According to embodiments of the present disclosure, the first source electrode is electrically connected to the first active layer through a via hole formed in the buffer layer.

According to embodiments of the present disclosure, the first source electrode is electrically connected to the first active layer through a via hole formed in the buffer layer and the gate insulating layer.

In another aspect of the present disclosure, embodiments of the present disclosure provide an array substrate. According to embodiments of the present disclosure, the array substrate includes the above thin film transistor assembly.

According to embodiments of the present disclosure, the array substrate further includes: a light blocking layer disposed in a same layer as and spaced from the first source electrode.

According to embodiments of the present disclosure, a material of the light blocking layer is the same as a material of the first source electrode.

According to embodiments of the present disclosure, the array substrate further includes a plurality of sub-pixels arranged in an array, wherein every two adjacent columns of sub-pixels constitute a pixel group, no thin film transistor is disposed between two adjacent pixel groups, and in each of the pixel groups, a first gap is provided between two columns of sub-pixels, and a second gap is provided between two adjacent rows of sub-pixels, and the thin film transistor assembly is disposed in an overlap of the first gap and the second gap.

According to embodiments of the present disclosure, the array substrate further includes a first sub-pixel, a third sub-pixel, a second sub-pixel, and a fourth sub-pixel sequentially arranged in a 2 by 2 matrix around each thin film transistor assembly, the first thin film transistor of the thin film transistor assembly is electrically connected to the first sub-pixel, and the second thin film transistor of the thin film transistor assembly is electrically connected to the second sub-pixel.

In still another aspect of the present disclosure, embodiments of the present disclosure provide a display panel. According to embodiments of the present disclosure, the display panel includes the above array substrate.

According to embodiments of the present disclosure, the display panel further includes: a plurality of first black matrixes disposed opposite to the array substrate, orthogonal projections of the plurality of first black matrixes on the substrate covering orthogonal projections of the first and second thin film transistors on the substrate, wherein each of the first black matrixes has a width of 15 µm to 25 µm.

According to embodiments of the present disclosure, the display panel further includes: a plurality of second black matrixes disposed in a same layer as the plurality of first black matrixes, an orthogonal projection of each of the plurality of second black matrixes on the substrate overlapping an orthogonal projection, on the substrate, of a gap between two adjacent pixel groups, wherein each of the second black matrixes has a width of 5 µm to 10 µm.

According to embodiments of the present disclosure, the display panel further includes: a plurality of first black matrixes disposed opposite to the array substrate, orthogonal projections of the plurality of first black matrixes on the substrate covering orthogonal projections of the first and second thin film transistors on the substrate; and a plurality of second black matrixes disposed in a same layer as the plurality of first black matrixes, an orthogonal projection of each of the plurality of second black matrixes on the substrate overlapping an orthogonal projection, on the substrate, of a gap between two adjacent pixel groups, wherein each of the plurality of second black matrixes has a less width than each of the plurality of first black matrixes.

DETAILED DESCRIPTION

Embodiments of the present disclosure will be described as follows in detail. The embodiments described below are exemplary, are only used to explain the present disclosure, and should not be construed to limit the present disclosure. The specific technology or condition that is not indicated in the embodiments conforms to the technology or condition described in literatures in the art or the product specification.

Figure 1:
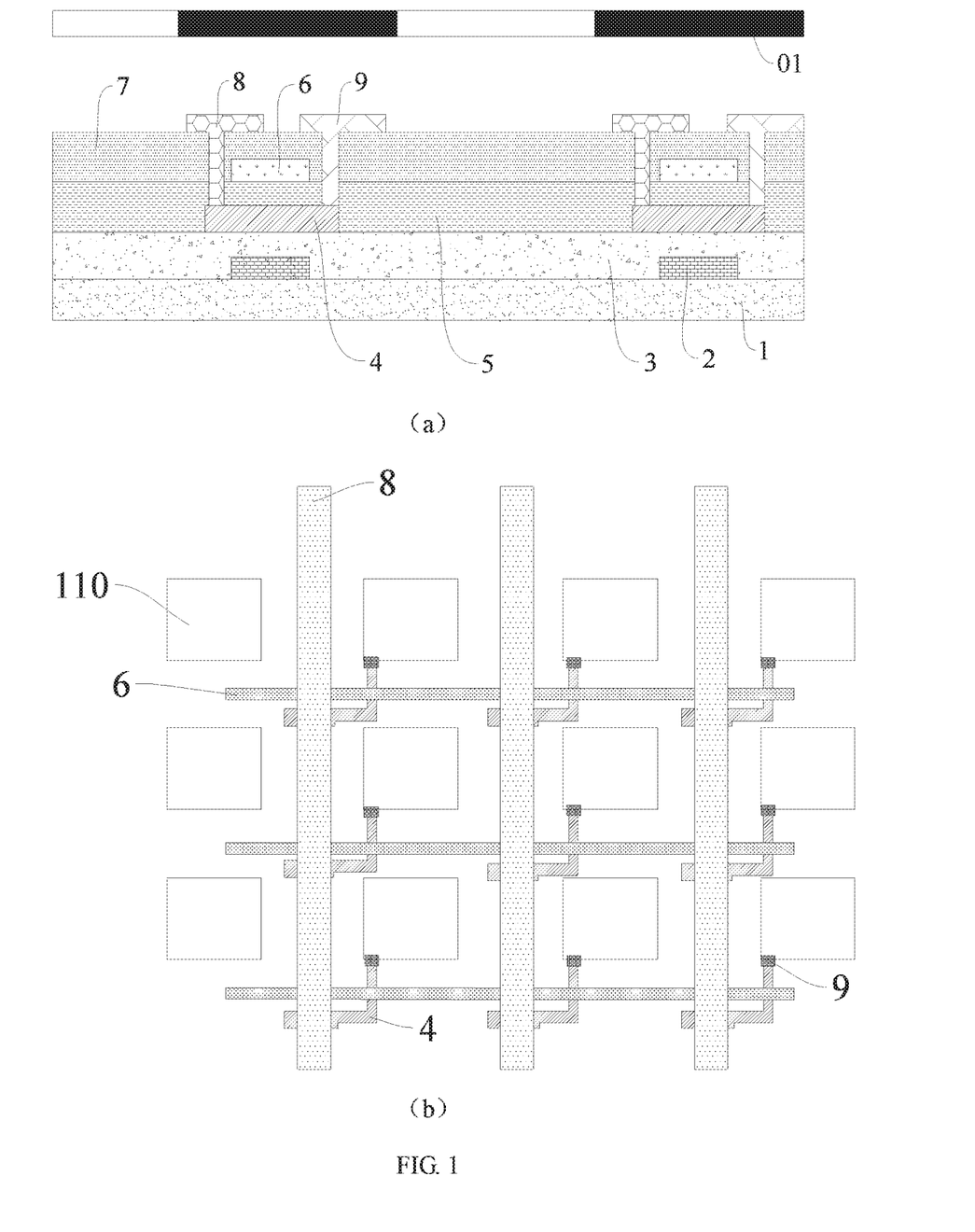
FIG. 1 is a schematic view showing a structure of a conventional display panel.

Currently, in order to improve a display quality and a display brightness of a display panel, an aperture ratio of the display panel is generally increased. FIG. 1(a) is a schematic sectional view showing a structure of a conventional display panel, and FIG. 1(b) is a schematic top view showing a structure of a conventional display panel (in which insulating layers are not shown). As shown in FIG. 1, a conventional display panel includes: a light blocking layer 2 disposed on a surface of a substrate 1, a first insulating layer 3 covering the light blocking layer 2 and disposed on the surface of the substrate 1, an active layer 4 disposed on a surface of the first insulating layer 3 facing away from the substrate 1, a second insulating layer 5 covering the active layer 4 and disposed on the surface of the first insulating layer 3 facing away from the substrate 1, a gate electrode 6 disposed on a surface of the second insulating layer 5 facing away from the substrate 1, a third insulating layer 7 covering the gate electrode 6 and disposed on the surface of the second insulating layer 5 facing away from the substrate 1, and a source electrode 8 and a drain electrode 9 disposed on a surface of the third insulating layer 7 facing away from the substrate 1, and electrically connected to the active layer 4 through via holes respectively. The inventors found that in the display panel with the above structure, only thin film transistors for controlling one column of sub-pixels of two adjacent columns of sub-pixels 110 are disposed in a gap between the two adjacent columns of sub-pixels 110, and an area occupied by the thin-film transistors is still large. Therefore, black matrixes 01 each having a large area are disposed in a color filter substrate to shield the thin film transistors, which results in a limited increase in the aperture ratio of the display panel, and thus a low display brightness. In order to further increase the aperture ratio of the display panel, the inventors improved an arrangement of the thin film transistors, which can effectively reduce the total area of the black matrixes.

Figure 2:
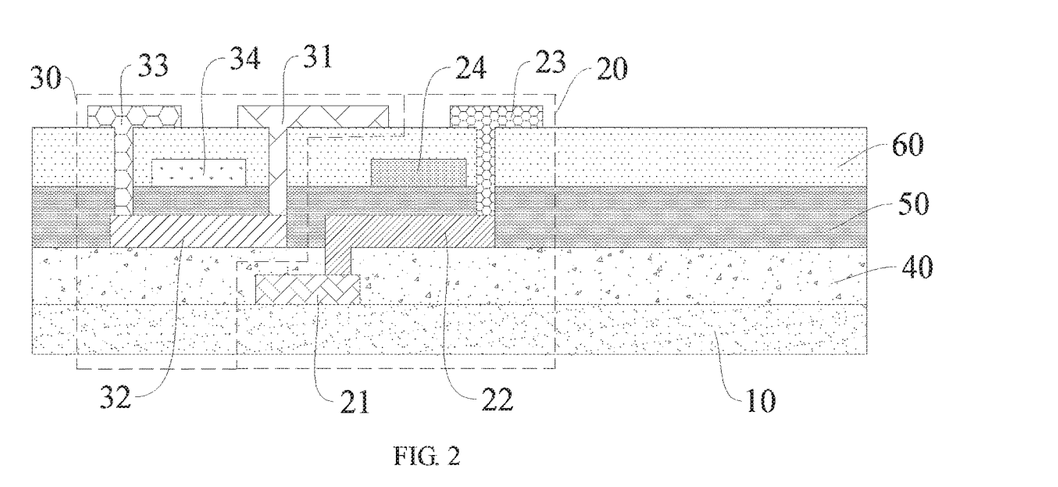
FIG. 2 is a schematic view showing a structure of a thin film transistor assembly according to an embodiment of the present disclosure.
Figure 3:
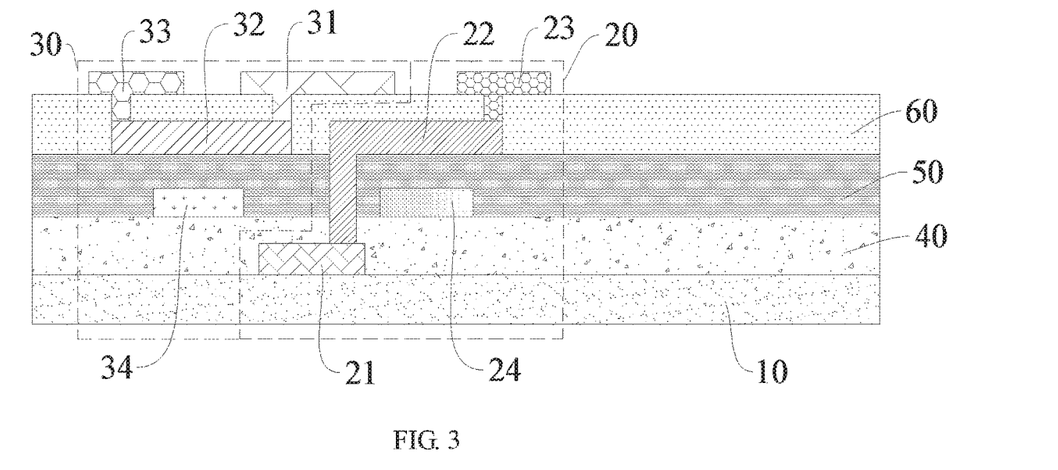
FIG. 3 is a schematic view showing a structure of a thin film transistor assembly according to another embodiment of the present disclosure.

In an aspect of the present disclosure, embodiments of the present disclosure provide a thin film transistor assembly. Referring to FIGS. 2 and 3, the thin film transistor assembly includes: a first thin film transistor 20 and a second thin film transistor 30 disposed on a substrate 10. The first thin film transistor 20 includes a first source electrode 21, a first drain electrode 23, and a first active layer 22, and the second thin film transistor 30 includes a second source electrode 31. The first source electrode 21 is disposed on a side of the first active layer 22 facing towards the substrate 10, the first drain electrode 23 is disposed on a side of the first active layer 22 facing away from the substrate 10, and an orthogonal projection of the first source electrode 21 on the substrate 10 overlaps an orthogonal projection of the second source electrode 31 on the substrate 10. Referring to FIGS. 2 and 3, in some embodiments of the present disclosure, the first source electrode 21 is disposed on the substrate 10. For example, the first source electrode 21 may be disposed on and in direct contact with a surface of the substrate 10.

Referring to FIGS. 2 and 3, in some embodiments of the present disclosure, the second thin film transistor 30 further includes a second drain electrode 33, and the second source electrode 31 and the second drain electrode 33 are disposed in a same layer as the first drain electrode 23.

Referring to FIGS. 2 and 3, in some embodiments of the present disclosure, the first source electrode 21 is disposed on the substrate 10. The thin film transistor assembly further includes: a buffer layer 40 disposed on the substrate 10 and covering the first source electrode 21; a gate insulating layer 50 disposed on a side of the buffer layer 40 facing away from the substrate 10; and an interlayer dielectric layer 60 disposed on a side of the gate insulating layer 50 facing away from the substrate 10. The first drain electrode 23, the second source electrode 31, and the second drain electrode 33 are disposed on a side of the interlayer dielectric layer 60 facing away from the substrate 10.

Referring to FIG. 2, in some embodiments of the present invention, the first active layer 22 and a second active layer 32 of the second thin film transistor 30 are disposed on the buffer layer 40, the gate insulating layer 50 covers the first active layer 22 and the second active layer 32, a first gate electrode 24 of the first thin film transistor 20 and a second gate electrode 34 of the second thin film transistor 30 are disposed on the gate insulating layer 50, and the interlayer dielectric layer 60 covers the first gate electrode 24 and the second gate electrode 34. The first source electrode 21 is electrically connected to the first active layer 22 through a via hole formed in the buffer layer 40.

Referring to FIG. 3, in some embodiments of the present disclosure, a first gate electrode 24 of the first thin film transistor 20 and a second gate electrode 34 of the second thin film transistor 30 are disposed on the buffer layer 40, the gate insulating layer 50 covers the first gate electrode 24 and the second gate electrode 34, the first active layer 22 and a second active layer 32 of the second thin film transistor 30 are disposed on the gate insulating layer 50, and the interlayer dielectric layer 60 covers the first active layer 22 and the second active layer 32. The first source electrode 21 is electrically connected to the first active layer 22 through a via hole formed in the buffer layer 40 and the gate insulating layer 50.

Thereby, the first source electrode and the first drain electrode of the first thin film transistor are disposed below and above the first active layer, respectively, and the orthogonal projection of the first source electrode on the substrate overlaps the orthogonal projection of the second source electrode on the substrate (that is, the first thin film transistor and the second thin film transistor are disposed crosswise). In this way, compared to thin film transistors arranged at intervals but not disposed crosswise in a conventional display panel, the thin film transistor assembly according to the embodiment of the present disclosure can greatly reduce an area occupied by the thin film transistor assembly on the substrate. Therefore, when the thin film transistor assembly is applied to a display panel, the total area of the black matrixes shielding the thin film transistors can be effectively reduced, thereby increasing the aperture ratio of the display panel, that is, improving a light transmittance of the display panel and thus the display brightness of the display panel.

In another aspect of the present disclosure, embodiments of the present disclosure provide a thin film transistor assembly. According to embodiments of the present disclosure, referring to FIG. 2, the thin film transistor assembly includes: a first thin film transistor 20 and a second thin film transistor 30 disposed on a substrate 10. The first thin film transistor 20 includes a first source electrode 21, a first drain electrode 23, and a first active layer 22, and the second thin film transistor 30 includes a second source electrode 31 and a second drain electrode 33. The first source electrode 21 is disposed on the side of the first active layer 22 facing towards the substrate 10, the first drain electrode 23 is disposed on the side of the first active layer 22 facing away from the substrate 10, the second source electrode 31 and the second drain electrode 33 are disposed in a same layer as the first drain electrode 23, and an orthogonal projection of the first source electrode 21 on the substrate 10 overlaps an orthogonal projection of the second source electrode 31 on the substrate 10. Thereby, the first source electrode 21 is disposed on the side of the first active layer 22 facing towards the substrate 10, the first drain electrode 23 is disposed on the side of the first active layer 22 facing away from the substrate 10, and the orthogonal projection of the first source electrode 21 on the substrate 10 overlaps the orthogonal projection of the second source electrode 31 on the substrate 10. In other words, the first thin film transistor 20 and the second thin film transistor 30 disposed crosswise. In this way, compared to thin film transistors arranged at intervals but not disposed crosswise in the conventional display panel shown in FIG. 1, the thin film transistor assembly according to the embodiment of the present disclosure can greatly reduce the area occupied by the thin film transistor assembly on the substrate. Therefore, when the thin film transistor assembly is applied to a display panel, the total area of the black matrixes shielding the thin film transistors can be effectively reduced, thereby increasing the aperture ratio of the display panel. As a result, a light transmittance of the display panel and thus the display brightness of the display panel can be improved.

It is to be noted that "the first thin film transistor and the second thin film transistor are disposed crosswise" described above means that an orthogonal projection of the first thin film transistor 20 on the substrate 10 overlaps an orthogonal projection of the second thin film transistor 30 on the substrate 10, "thin film transistors arranged at intervals but not disposed crosswise" described above means that orthogonal projections of the thin film transistors on the substrate do not overlap one another, and "an area occupied by the thin film transistor assembly on the substrate" described above refers to an area of an orthogonal projection of the thin film transistor assembly on the substrate.

According to embodiments of the present disclosure, in order to further reduce the area occupied by the thin film transistor assembly on the substrate, referring to FIG. 2, the orthogonal projection of the second source electrode 31 on the substrate 10 covers the orthogonal projection of the first source electrode 21 on the substrate 10. Thereby, the area occupied by the thin film transistor assembly on the substrate can be further reduced, so that the aperture ratio of the display panel with the thin film transistor assembly is increased, improving the brightness of the display panel.

According to embodiments of the present disclosure, there is no particular requirement for a specific manner of the electrical connection between the first source electrode and the first active layer. In some embodiments, the first source electrode is electrically connected to the first active layer in such a manner that they are in direct contact with each other. In some other embodiments, an insulating layer is disposed between the first source electrode and the first active layer, and the first source electrode is electrically connected to the first active layer through a via hole formed in the insulating layer.

According to embodiments of the present disclosure, referring to FIGS. 2 and 3, the second source electrode 31 is disposed between the first drain electrode 23 and the second drain electrode 33 in an arrangement direction of the first thin film transistor 20 and the second thin film transistor 30, thereby facilitating a wiring of the second source electrode 31, the first drain electrode 23, and the second drain electrode 33. Furthermore, the area occupied by the thin film transistor assembly on the substrate can be further reduced, and thus the aperture ratio of the display panel can be increased.

In some embodiments of the present disclosure, referring to FIG. 2, the first thin film transistor and the second thin film transistor are both top-gate thin film transistors. Specifically, the first source electrode 21 is disposed on a surface of the substrate 10. A buffer layer 40 is disposed on the surface of the substrate 10 and covers the first source electrode 21. The first active layer 22 and a second active layer 32 of the second thin film transistor 30 are disposed at intervals on a side of the buffer layer 40 facing away from the substrate 10, and the first source electrode 21 is electrically connected to the first active layer 22 through a via hole. A gate insulating layer 50 is disposed on a side of the buffer layer 40 facing away from the substrate 10, and covers the first active layer 22 and the second active layer 32. A first gate electrode 24 of the first thin film transistor 20 and a second gate electrode 34 of the second thin film transistor 30 are disposed on a side of the gate insulating layer 50 facing away from the substrate 10. An interlayer dielectric layer 60 is disposed on a side of the gate insulating layer 50 facing away from the substrate 10, and covers the first gate electrode 24 and the second gate electrode 34. The first drain electrode 23, the second source electrode 31, and the second drain electrode 33 are disposed on a side of the interlayer dielectric layer 60 facing away from the substrate 10, and the first drain electrode 23 is electrically connected to the first active layer 22 through a via hole, and the second source electrode 31 and the second drain electrode 33 are electrically connected to the second active layer 32 through via holes, respectively.

In some other embodiments of the present disclosure, referring to FIG. 3, the first thin film transistor and the second thin film transistor are both bottom-gate thin film transistors. Specifically, the first source electrode 21 is disposed on a surface of the substrate 10. A buffer layer 40 is disposed on the surface of the substrate 10 and covers the first source electrode 21. A first gate electrode 24 of the first thin film transistor 20 and a second gate electrode 34 of the second thin film transistor 30 are disposed on a side of the buffer layer 40 facing away from the substrate 10. A gate insulating layer 50 is disposed on a side of the buffer layer 40 facing away from the substrate 10, and covers the first gate electrode 24 and the second gate electrode 34. The first active layer 22 and a second active layer 32 of the second thin film transistor 30 are disposed at intervals on a side of the gate insulating layer 50 facing away from the substrate 10, and the first source electrode 21 is electrically connected to the first active layer 22 through a via hole. An interlayer dielectric layer 60 is disposed on a side of the gate insulating layer 50 facing away from the substrate 10, and covers the first active layer 22 and the second active layer 32. The first drain electrode 23, the second source electrode 31, and the second drain electrode 33 are disposed on a side of the interlayer dielectric layer 60 facing away from the substrate 10, and the first drain electrode 23 is electrically connected to the first active layer 22 through a via hole and the second source electrode 31 and the second drain electrode 33 are electrically connected to the second active layer 32 through via holes, respectively.

According to embodiments of the present disclosure, there is no particular limitation on materials of the above structures. Those skilled in the art could flexibly choose conventional materials for manufacturing them according to actual requirements. For example, the specific type of the substrate may be a glass substrate, a polymer substrate, or the like; specific materials of the structures such as the buffer layer, the gate insulating layer, and the interlayer dielectric layer may be selected from materials such as silicon oxide, silicon nitride, silicon oxynitride, and new-type organic insulating materials; materials of the first active layer and the second active layer may be selected from materials such as amorphous silicon, polysilicon, and indium gallium zinc oxide (IGZO); and materials for forming the first source electrode, the first drain electrode, the second source electrode, and the second drain electrode may be selected from metals such as silver, aluminum, copper, molybdenum, and neodymium or alloys of the metals, or transparent conductive oxides such as indium tin oxide (ITO), and aluminum zinc oxide (AZO).

In another aspect of the present disclosure, embodiments of the present disclosure provide an array substrate. According to embodiments of the present disclosure, the array substrate includes the above thin film transistor assembly. Thereby, the area occupied by the thin film transistor on the substrate in the array substrate is small, which can effectively reduce the total area of the black matrixes in the display panel, improving the aperture ratio of the display panel and thus the display brightness of the display panel.

Figure 4:
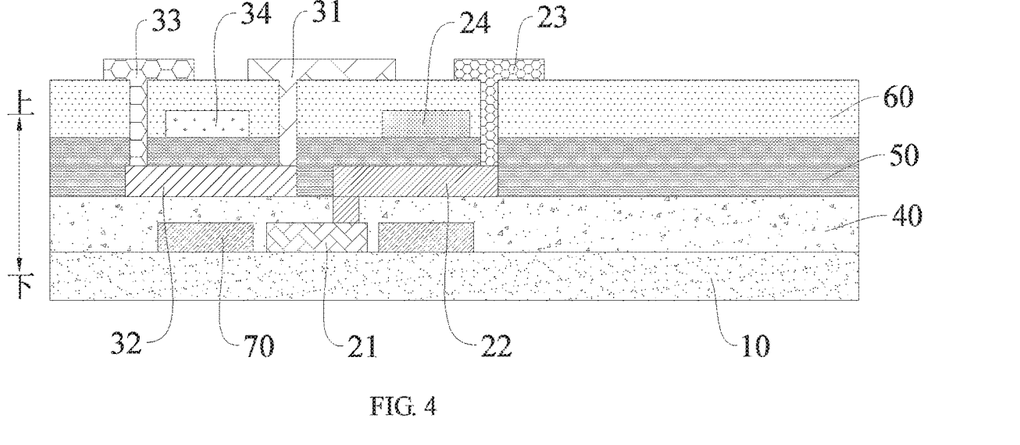
FIG. 4 is a schematic sectional view showing a structure of an array substrate according to an embodiment of the present disclosure.

According to embodiments of the present disclosure, referring to FIG. 4, the array substrate further includes: a light blocking layer 70 disposed in a same layer as and spaced from the first source electrode 21 of the thin film transistor assembly. A material of the light blocking layer 70 may be the same as a material of the first source electrode 21. Thereby, the light blocking layer is disposed to prevent light from irradiating a channel region of the active layer, and the light blocking layer and the first source electrode can be manufactured by a single patterning process, which can shorten a manufacturing process. In addition, the light blocking layer is spaced from the first source electrode (that is, the light blocking layer is insulated from the first source electrode), which can prevent a voltage from being generated in the light blocking layer, thereby preventing the voltage from generating an electric field in the active layer to affect the performance of a channel. It would be appreciated by those skilled in the art that when the light blocking layer and the first source electrode are formed by the single patterning process, a transparent material such as ITO is unsuitable for the first source electrode. Otherwise, the light blocking layer will lose its light blocking effect.

Figure 5:
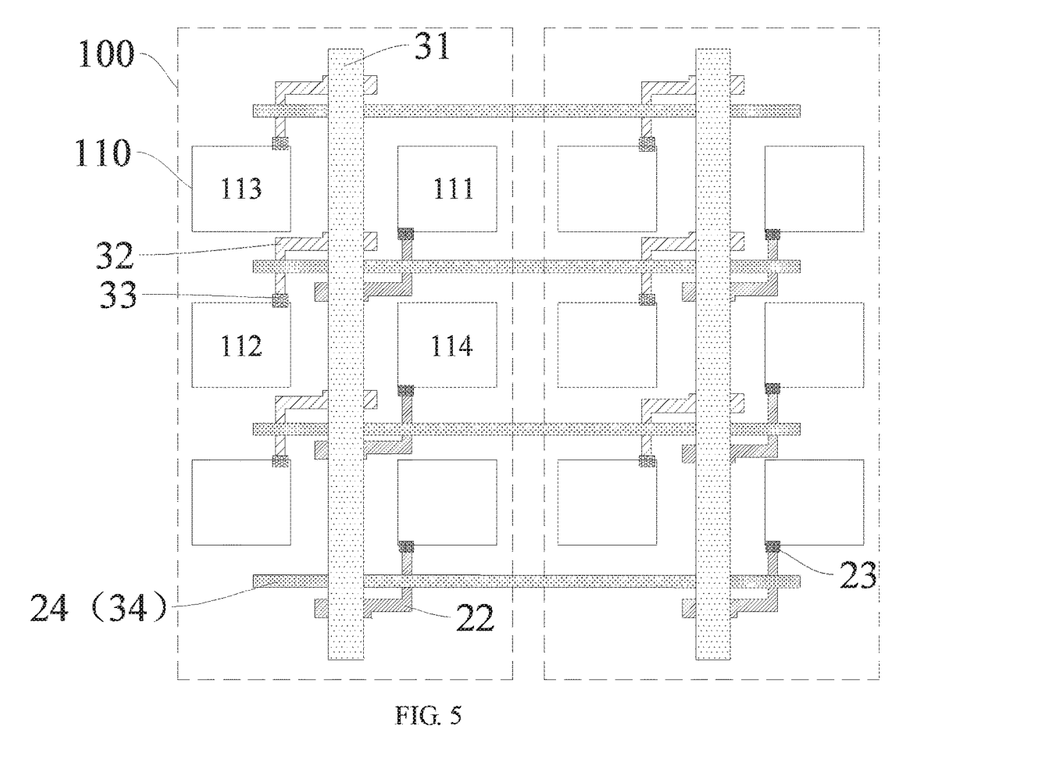
FIG. 5 is a schematic top view showing the structure of the array substrate according to the embodiment of the present disclosure.

According to embodiments of the present disclosure, referring to FIG. 5, the array substrate further includes a plurality of sub-pixels 110 arranged in an array. Every two adjacent columns of sub-pixels 110 constitute a pixel group 100, no thin film transistor is disposed between two adjacent pixel groups 100, and in each of the pixel groups 100, a first gap is provided between two columns of sub-pixels 110, and a second gap is provided between two adjacent rows of sub-pixels 110, and the thin film transistor assembly is disposed in an overlap of the first gap and the second gap. Thereby, not only the thin film transistors for controlling two columns of sub-pixels in the same pixel group are located in the gap between the two columns of sub-pixels, but the above arrangement can also make full use of the gap between the sub-pixels to further reduce the area occupied by the thin film transistor assembly on the substrate, increasing the aperture ratio of the display panel with the array substrate.

It is to be noted that "the thin film transistor assembly is disposed in an overlap of the first gap and the second gap" described above means that most of the structures in the thin film transistor assembly are disposed in the overlap of the first gap and the second gap (or that most of an orthogonal projection of the thin film transistor assembly on the substrate falls within an orthogonal projection of the overlap on the substrate), with only a small part of the structures (for example, the drain electrode connected to the sub-pixel) deviating slightly from the overlap.

According to embodiments of the present disclosure, referring to FIG. 5, the array substrate further includes a first sub-pixel 111, a third sub-pixel 113, a second sub-pixel 112, and a fourth sub-pixel 114 sequentially arranged in a 2 by 2 matrix around each thin film transistor assembly. In other words, the first sub-pixel 111 and the second sub-pixel 112 are disposed diagonally, and the third sub-pixel 113 and the fourth sub-pixel 114 are disposed diagonally. The first thin film transistor of the thin film transistor assembly is electrically connected to the first sub-pixel 111, and the second thin film transistor of the thin film transistor assembly is electrically connected to the second sub-pixel 112. Thereby, wirings of the thin film transistor assembly can be more reasonably arranged, the gap between the two columns of sub-pixels can be reasonably used, the area occupied by the thin film transistor assembly on the substrate can be reduced as much as possible, and the aperture ratio of the display panel can be increased, thereby improving the display brightness of the display panel.

Figure 6:
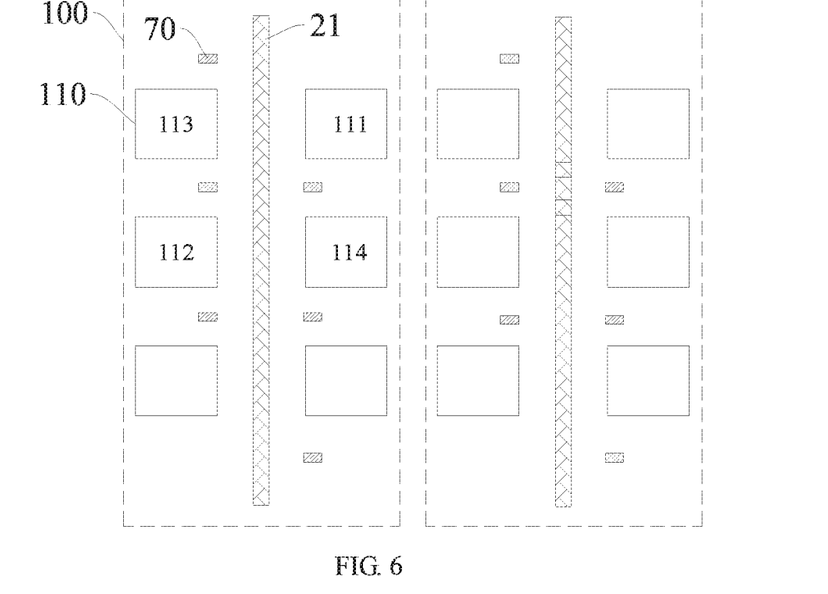
FIG. 6 is a schematic top view showing the structure of the array substrate according to the embodiment of the present disclosure.
Figure 7:
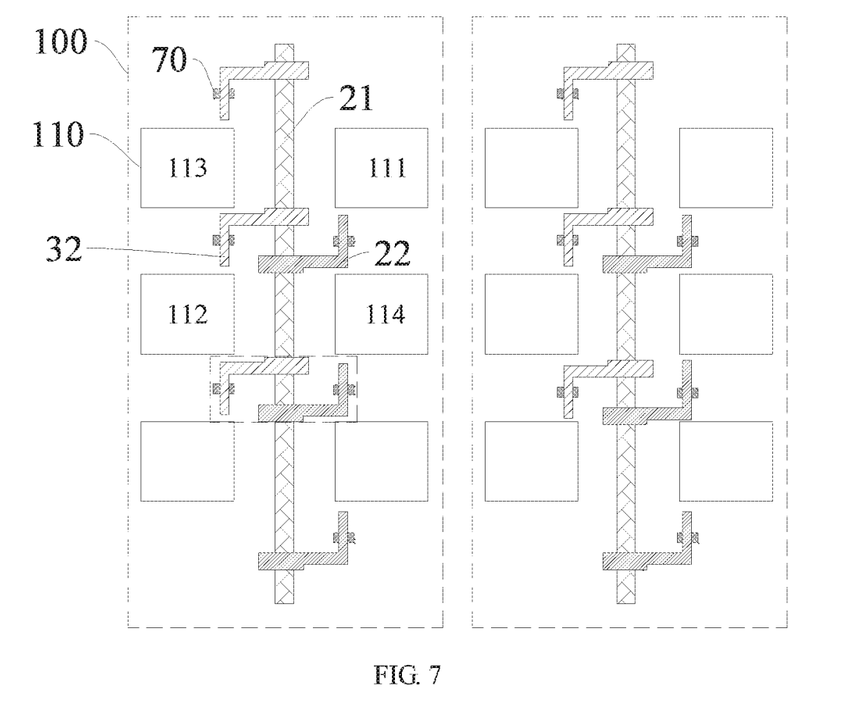
FIG. 7 is a schematic top view showing the structure of the array substrate according to the embodiment of the present disclosure.
Figure 8:
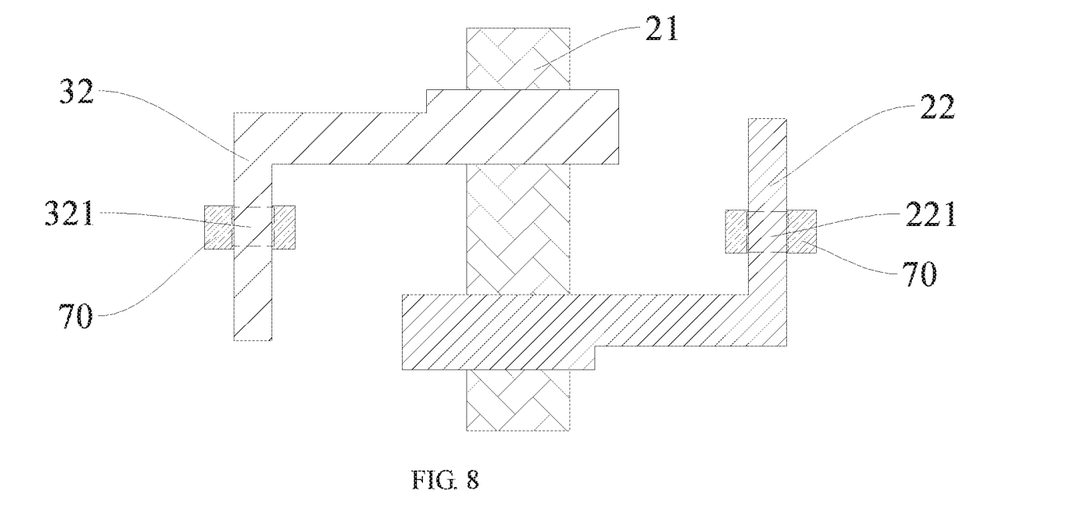
FIG. 8 is a schematic partial enlarged view of the thin film transistor assembly shown in FIG. 7.

FIGS. 5-7 and 9 are schematic top views showing a structure of an array substrate according to an embodiment of the present disclosure, and FIG. 8 is a schematic partial enlarged view of the thin film transistor assembly shown in FIG. 7, in which structures such as the substrate, the buffer layer, the gate insulating layer, and the interlayer dielectric layer are not shown. The structure of the array substrate will be described in detail below by taking a top-gate thin film transistor as an example with reference to FIGS. 5-9.

Referring to FIG. 6, a first source electrode 21 and a light blocking layer 70 are disposed on a substrate, and then a buffer layer is formed. The first source electrode 21 has a stripe structure and can constitute first source electrodes of all first thin film transistors of a same pixel group 100. That is, the strip-shaped source electrode disposed in a same layer as the light blocking layer controls a column of first thin film transistors of the same pixel group 100 as the first source electrodes of the column of first thin film transistors.

Referring to FIGS. 7 and 8, a first active layer 22 and a second active layer 32 are disposed on a surface of the buffer layer facing away from the substrate, and the first active layer 22 is electrically connected to the first source electrode 21 through a via hole located in a position where the first active layer 22 crosses the first source electrode 21. Orthogonal projections of the light blocking layers 70 on the substrate cover an orthogonal projection of a first channel region 221 of the first active layer 22 on the substrate, and an orthogonal projection of a second channel region 321 of the second active layer 32 on the substrate, respectively. In other words, in FIGS. 7 and 8, the first channel region 221 of the first active layer and the second channel region 321 of the second active layer cover parts of the light blocking layers 70, respectively. After that, a gate insulating layer is disposed.

Figure 9:
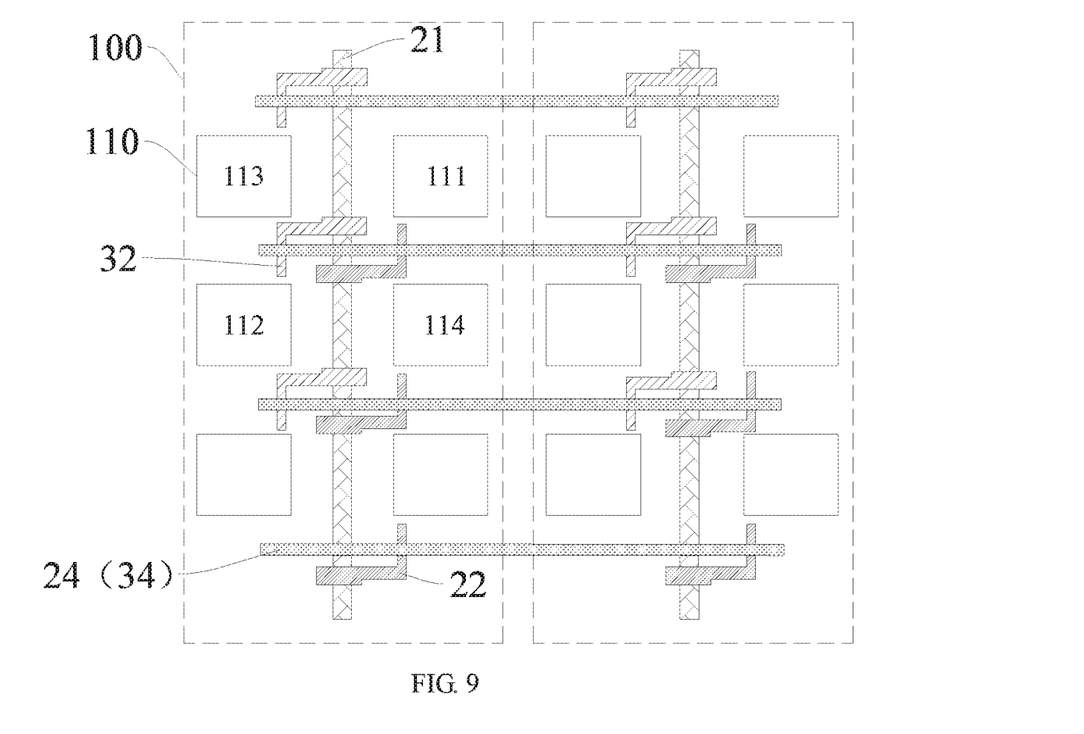
FIG. 9 is a schematic top view showing the structure of the array substrate according to the embodiment of the present disclosure.

Referring to FIG. 9, a strip-shaped gate electrode is formed on a surface of the gate insulating layer facing away from the substrate. The strip-shaped gate electrode constitutes a first gate electrode 24 and a second gate electrode 34. An orthogonal projection of the first gate electrode 24 on the substrate covers the orthogonal projection of the first channel region 221 on the substrate, and an orthogonal projection of the second gate electrode 34 on the substrate covers the orthogonal projection of the second channel region 321 on the substrate. Then, an interlayer dielectric layer is formed.

Referring to FIG. 5, a first drain electrode 23, a second source electrode 31, and a second drain electrode 33 are formed on a surface of the interlayer dielectric layer facing away from the substrate. In other words, the first drain electrode 23, the second source electrode 31, and the second drain electrode 33 may be formed by a single patterning process. An orthogonal projection of the second source electrode 31 on the substrate covers an orthogonal projection of the first source electrode 21 on the substrate. In other words, in FIG. 5, the first source electrode 21 is covered by the second source electrode 31. The first drain electrode 23 is electrically connected to the first active layer 22 through a via hole, the second source electrode 31 is electrically connected to the second active layer 32 through a via hole, and the second drain electrode 33 is electrically connected to the second active layer 32 through a via hole. As shown in FIG. 5, the second source electrode 31 has a stripe structure, and the first drain electrode 23 and the second drain electrode 33 have only flake shape. Therefore, as described above, the second source electrode 31 is disposed between the first drain electrode 23 and the second drain electrode 33 in an arrangement direction of the first thin film transistor 20 and the second thin film transistor 30. As a result, the area occupied by the thin film transistor assembly on the substrate can be effectively reduced, thereby reducing the total area of the black matrixes in the display panel.

In still another aspect of the present disclosure, embodiments of the present disclosure provide a display panel. According to embodiments of the present disclosure, the display panel includes the above array substrate. Therefore, the display panel has a large aperture ratio and a high light transmittance. The display brightness of the display panel can be effectively improved.

Figure 10:
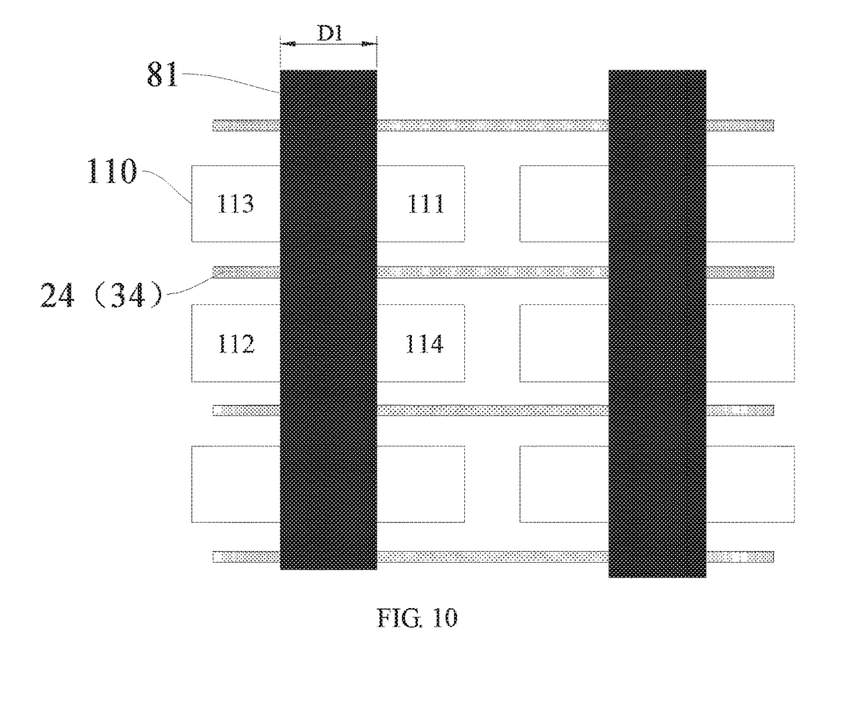
FIG. 10 is a schematic top view showing a structure of a display panel according to an embodiment of the present disclosure.
Figure 11:
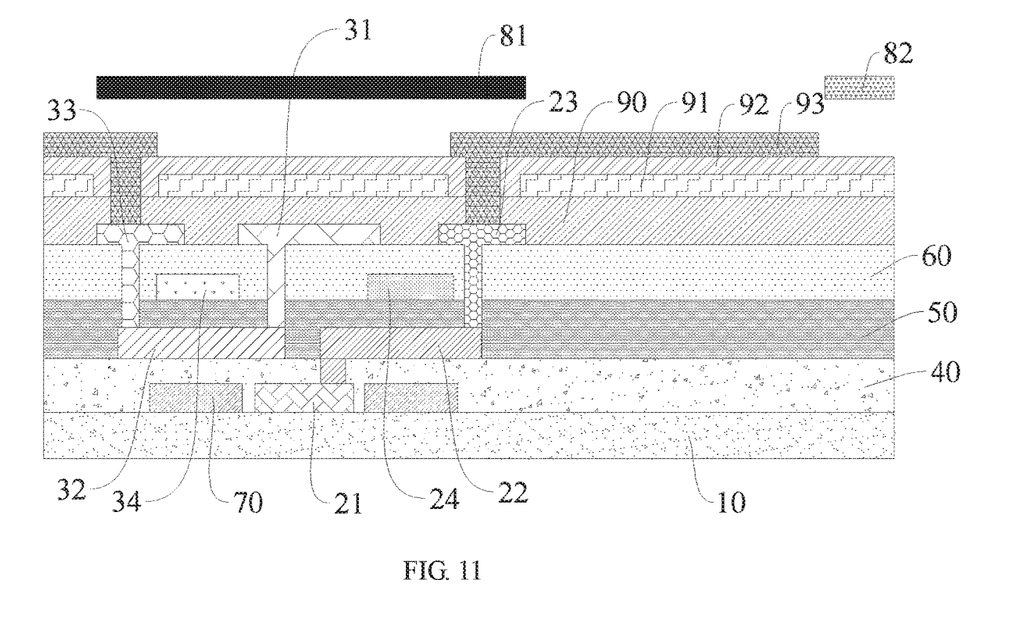
FIG. 11 is a schematic sectional view showing a structure of a display panel according to an embodiment of the present disclosure.

According to embodiments of the present disclosure, referring to FIGS. 10 and 11, the display panel further includes: a plurality of first black matrixes 81 disposed opposite to the array substrate. Orthogonal projections of the plurality of first black matrixes 81 on the substrate 10 cover orthogonal projections of the first and second thin film transistors on the substrate. Each of the first black matrixes has a width D1 of 15 μm to 25 μm, for example, 15 μm, 17 μm, 19 μm, 21 μm, 23 μm, or 25 μm. Thereby, the width of the first black matrix in the embodiment of the present disclosure is comparable to the width of the black matrix shown in FIG. 1, but one first black matrix in the embodiment of the present disclosure can cover the thin film transistors for two columns of sub-pixels simultaneously, so that the total area of the black matrixes in the display panel can be greatly reduced, and the aperture ratio of the display panel can be improved.

It would be appreciated by those skilled in the art that, referring to FIG. 11, the display panel further includes: a planarization layer 90 disposed on the surface of the interlayer dielectric layer 60 facing away from the substrate and covering the first drain electrode 23, the second source electrode 31, and the second drain electrode 33; a common electrode 91 disposed on a surface of the planarization layer 90 facing away from the substrate; an insulating layer 92 disposed on a surface of the common electrode 91 facing away from the substrate 10; and pixel electrodes 93 disposed on a surface of the insulating layer 92 facing away from the substrate 10 and electrically connected with the first drain electrode 23 and the second drain electrode 33 through via holes. Thereby, a display function of the display panel is achieved. It would be appreciated by those skilled in the art that the display panel further includes other structures (not shown) necessary for a display panel, such as a liquid crystal layer, and they are no longer described herein for the sake of brevity.

Figure 12:
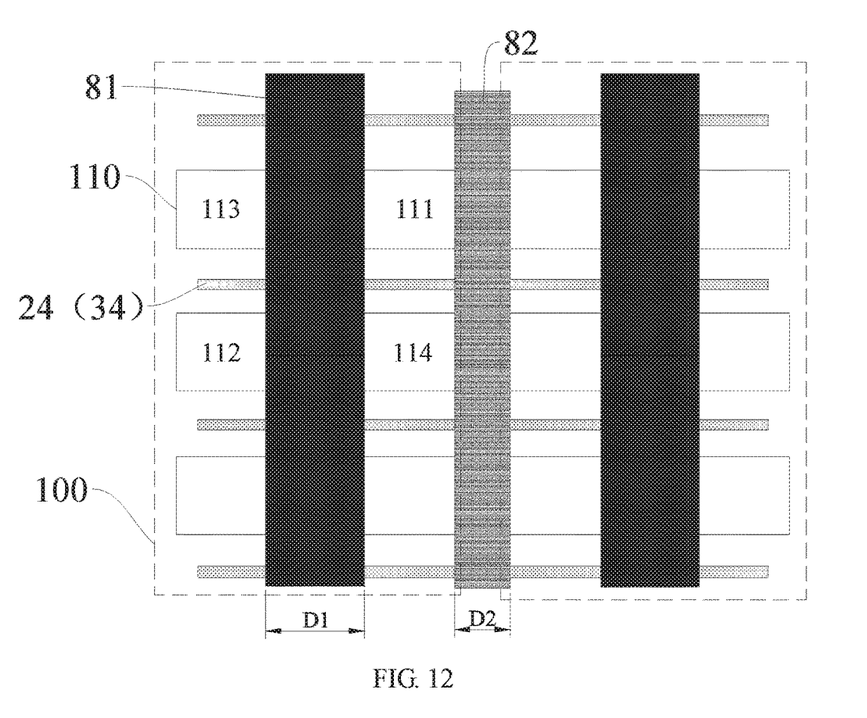
FIG. 12 is a schematic top view showing a structure of a display panel according to an embodiment of the present disclosure.
Figure 13:
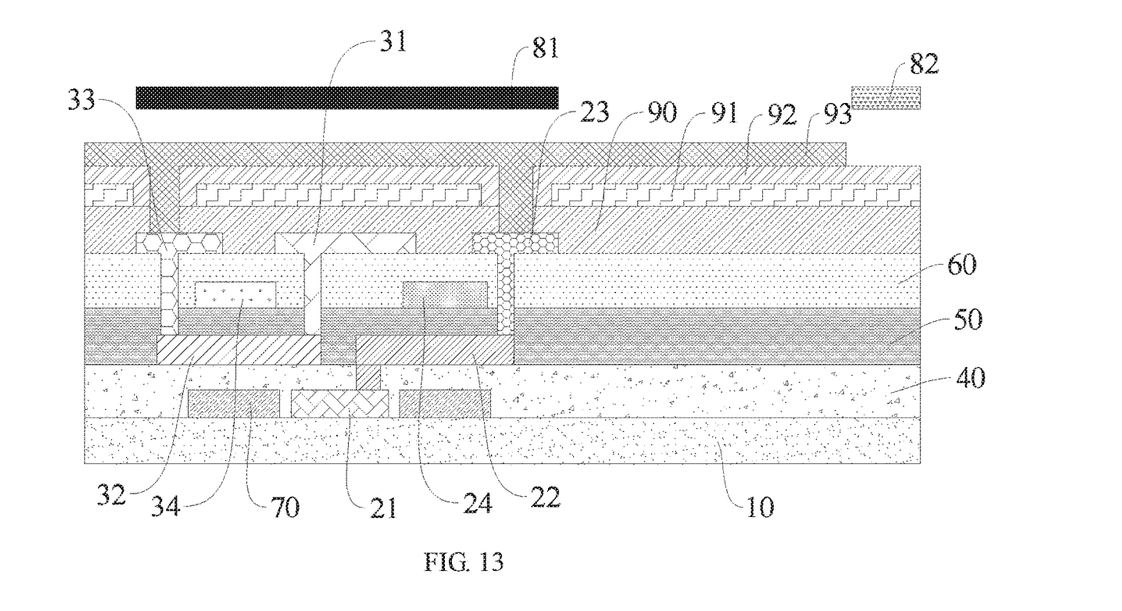
FIG. 13 is a schematic sectional view showing a structure of a display panel according to another embodiment of the present disclosure.

According to embodiments of the present disclosure, referring to FIGS. 12 and 13, the display panel further includes: a plurality of second black matrixes 82 disposed in a same layer as the plurality of first black matrixes 81. An orthogonal projection of each of the plurality of second black matrixes 82 on the substrate 10 overlap an orthogonal projection, on the substrate 10, of a gap between two adjacent pixel groups 100. Each of the second black matrixes has a width of 5 μm to 10 μm, for example, 5 μm, 6 μm, 7 μm, 8 μm, 9 μm, or 10 μm. Thereby, the second black matrix is disposed to prevent an occurrence of a light mixture between two adjacent columns of sub-pixels of two adjacent pixel groups to affect the display effect of the display panel. However, due to the small width of the second black matrix, the total area of the black matrixes can still be effectively reduced and thus the aperture ratio of the display panel is improved.

In some embodiments, the orthogonal projection of each of the plurality of second black matrixes 82 on the substrate 10 covers the orthogonal projection, on the substrate 10, of the gap between two adjacent pixel groups 100. Thereby, the occurrence of the light mixture between two adjacent columns of sub-pixels of two adjacent pixel groups is more effectively prevented, while the total area of the black matrixes in the display panel is reduced.

If all structures of the thin film transistor group cannot be shielded with the first black matrix, those skilled in the art may dispose a third black matrix (not shown) with a certain width between two adjacent rows of sub-pixels according to actual conditions, thereby ensuring the good operating performance of the thin film transistor.

Referring to FIGS. 12 and 13, in some embodiments of the present disclosure, the display panel further includes: a plurality of first black matrixes 81 disposed opposite to the array substrate, orthogonal projections of the plurality of first black matrixes 81 on the substrate 10 covering orthogonal projections of the first and second thin film transistors 20 and 30 on the substrate 10; and a plurality of second black matrixes 82 disposed in a same layer as the plurality of first black matrixes 81, an orthogonal projection of each of the plurality of second black matrixes 82 on the substrate 10 overlapping an orthogonal projection, on the substrate 10, of a gap between two adjacent pixel groups. Each of the plurality of second black matrixes 82 has a less width than each of the plurality of first black matrixes 81. The display panel may further include: a color filter substrate including the first matrixes 81 and the second matrixes 82; and a liquid crystal layer between the array substrate and the color filter substrate.

According to embodiments of the present disclosure, the display panel may be applied to various types of electronic apparatuses, for example electronic apparatuses with a display function, such as a mobile phone, a notebook computer, an iPad, a TV and a game console.

According to embodiments of the present disclosure, the display panel may be applied to any products or parts having a display function such as a tablet computer, a television, a display, a mobile phone, a digital frame, a personal digital assistant, and navigator. In the description of the present disclosure, it should be appreciated that orientations or positional relationships indicated by terms such as "above/on" and "below" are based on orientations or positional relationships shown in the accompanying drawings, are merely used to facilitate the description of the present disclosure and simplification of the description, but do not indicate or imply that a device or an element of which an orientation or positional relationship is indicated must have the particular orientation and must be configured and operated in the particular orientation. Therefore, the orientations or positional relationships should not be construed to limit the present disclosure.

Moreover, the terms "first" and "second" are used for only descriptive purposes and should not to be construed as indicating or implying a relative importance or implicitly indicating the numbers of technical features indicated by them. Thus, a feature defined with the term "first" or "second" may include one or more of the features either explicitly or implicitly. In the description of the present disclosure, "plurality of" means two or more unless otherwise explicitly and specifically defined.

In the present disclosure, unless explicitly stated and defined otherwise, a first feature "above/on" or "below" a second feature may be that the first feature is in direct contact with the second feature, or the first feature is in indirect contact with the second feature through an intermediate medium. Moreover, a first feature "above" a second feature may be that the first feature is directly above or obliquely above the second feature, or may only indicate that the first feature is higher in level than the second feature. A first feature "below" a second feature may be that the first feature is directly below or obliquely below the second feature, or may only indicate that the first feature is lower in level than the second feature.

In the description of the present specification, the description with reference to the term "an embodiment", "some embodiments", "an example", "specific example", "some examples" or the like means that a specific feature, structure, material or characteristic described in conjunction with the embodiment or example is included in at least one embodiment or example of the present disclosure. In the present specification, the illustrative references to the above terms are not necessarily directed to the same embodiment or example. Furthermore the described specific features, structures, materials or characteristics may be combined in appropriate manners in any one or more embodiments or examples. In addition, those skilled in the art could combine the different embodiments or examples and the features of the different embodiments or examples described in the description unless they conflict.

While the embodiments of the present disclosure have been shown and described above, it will be appreciated that the above embodiments are illustrative and should not be construed as limiting the prevent disclosure. Those skilled in the art may make changes, modifications, substitutions and alterations to the above embodiments within the scope of the present disclosure.

What is claimed is:

1. A thin film transistor assembly comprising:
a first thin film transistor and a second thin film transistor disposed on a substrate, wherein:
the first thin film transistor comprises a first source electrode, a first drain electrode, and a first active layer, and the second thin film transistor comprises a second source electrode,
the first source electrode is disposed on a side of the first active layer facing towards the substrate,
the first drain electrode is disposed on a side of the first active layer facing away from the substrate,
an orthogonal projection of the first source electrode on the substrate overlaps an orthogonal projection of the second source electrode on the substrate,
the second thin film transistor further comprises a second drain electrode, and the second source electrode and the second drain electrode are disposed in a same layer as the first drain electrode, and
the first source electrode is disposed on the substrate;
a buffer layer disposed on the substrate and covering the first source electrode;
a gate insulating layer disposed on a side of the buffer layer facing away from the substrate; and
an interlayer dielectric layer disposed on a side of the gate insulating layer facing away from the substrate, the first drain electrode, the second source electrode, and the second drain electrode being disposed on a side of the interlayer dielectric layer facing away from the substrate.

2. The thin film transistor assembly of claim 1, wherein:
the orthogonal projection of the second source electrode on the substrate covers the orthogonal projection of the first source electrode on the substrate.

3. The thin film transistor assembly of claim 1, wherein:
the second source electrode is disposed between the first drain electrode and the second drain electrode in an arrangement direction of the first thin film transistor and the second thin film transistor.

4. The thin film transistor assembly of claim 1, wherein:
the first thin film transistor and the second thin film transistor are both top-gate thin film transistors, or the first thin film transistor and the second thin film transistor are both bottom-gate thin film transistors.

5. The thin film transistor assembly of claim 1, wherein:
the first active layer and a second active layer of the second thin film transistor are disposed on the buffer layer, the gate insulating layer covers the first active layer and the second active layer, a first gate electrode of the first thin film transistor and a second gate electrode of the second thin film transistor are disposed on the gate insulating layer, and the interlayer dielectric layer covers the first gate electrode and the second gate electrode.

6. The thin film transistor assembly of claim 5, wherein:
the first source electrode is electrically connected to the first active layer through a via hole formed in the buffer layer.

7. The thin film transistor assembly of claim 1, wherein:
a first gate electrode of the first thin film transistor and a second gate electrode of the second thin film transistor are disposed on the buffer layer, the gate insulating layer covers the first gate electrode and the second gate electrode, the first active layer and a second active layer of the second thin film transistor are disposed on the gate insulating layer, and the interlayer dielectric layer covers the first active layer and the second active layer.

8. The thin film transistor assembly of claim 7, wherein:
the first source electrode is electrically connected to the first active layer through a via hole formed in the buffer layer and the gate insulating layer.

9. An array substrate comprising the thin film transistor assembly of claim 1.

10. The array substrate of claim 9, further comprising:
a light blocking layer disposed in a same layer as and spaced from the first source electrode.

11. The array substrate of claim 10, wherein:
a material of the light blocking layer is the same as a material of the first source electrode.

12. The array substrate of claim 9, further comprising:
a plurality of sub-pixels arranged in an array, wherein every two adjacent columns of sub-pixels constitute a pixel group, no thin film transistor is disposed between two adjacent pixel groups,
wherein in each of the pixel groups, a first gap is provided between two columns of sub-pixels, and a second gap is provided between two adjacent rows of sub-pixels, and the thin film transistor assembly is disposed in an overlap of the first gap and the second gap.

13. The array substrate of claim 12, further comprising:
a first sub-pixel, a third sub-pixel, a second sub-pixel, and a fourth sub-pixel sequentially arranged in a 2 by 2 matrix around each thin film transistor assembly,
wherein the first thin film transistor of the thin film transistor assembly is electrically connected to the first sub-pixel, and the second thin film transistor of the thin film transistor assembly is electrically connected to the second sub-pixel.

14. A display panel comprising:
the array substrate of claim 9.

15. The display panel of claim 14, further comprising:
a plurality of first black matrixes disposed opposite to the array substrate, orthogonal projections of the plurality of first black matrixes on the substrate covering orthogonal projections of the first and second thin film transistors on the substrate,
wherein each of the first black matrixes has a width of 15 µm to 25 µm.

16. The display panel of claim 15, further comprising:
a plurality of second black matrixes disposed in a same layer as the plurality of first black matrixes, an orthogonal projection of each of the plurality of second black matrixes on the substrate overlapping an orthogonal projection, on the substrate, of a gap between two adjacent pixel groups,
wherein each of the second black matrixes has a width of 5 µm to 10 µm.

17. The display panel of claim 14, further comprising:
a plurality of first black matrixes disposed opposite to the array substrate, orthogonal projections of the plurality of first black matrixes on the substrate covering orthogonal projections of the first and second thin film transistors on the substrate; and
a plurality of second black matrixes disposed in a same layer as the plurality of first black matrixes, an orthogonal projection of each of the plurality of second black matrixes on the substrate overlapping an orthogonal projection, on the substrate, of a gap between two adjacent pixel groups, wherein each of the plurality of second black matrixes has a less width than each of the plurality of first black matrixes.

* * * * *